Figure 1:
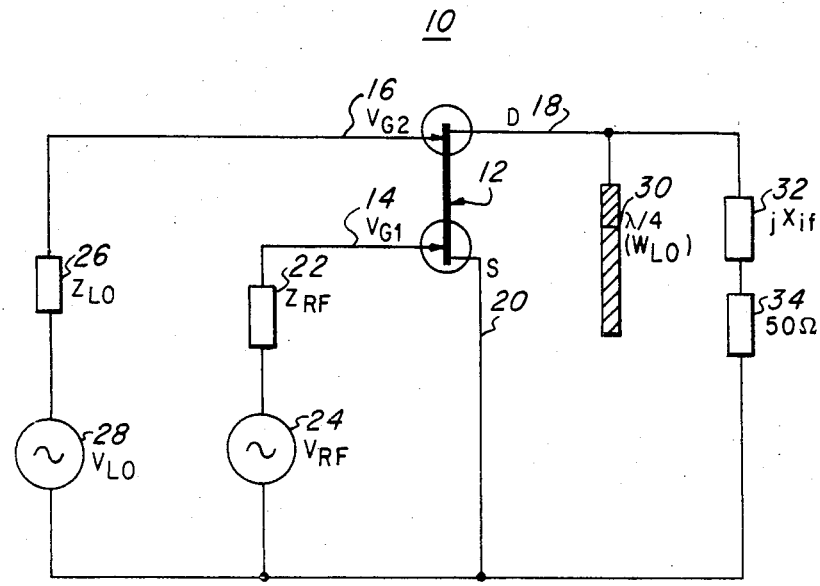

United States Patent [19]

Pavio et al.

[11] Patent Number: 4,658,440
[45] Date of Patent: Apr. 14, 1987

[54] SINGLE BALANCED SELF-OSCILLATING DUAL GATE FET MIXER

[75] Inventors: Anthony M. Pavio; Kevin J. Anderson, both of Plano, Tex.

[73] Assignee: Texas Instruments Incorporated, Dallas, Tex.

[21] Appl. No.: 635,093

[22] Filed: Jul. 27, 1984

[51] Int. Cl.$^4$ ............................................. H04B 1/26
[52] U.S. Cl. .................... 455/324; 455/325; 455/327; 455/331; 455/332; 455/333; 455/317; 455/319
[58] Field of Search ............... 455/321, 324, 325, 327, 455/331, 332, 333, 317, 319, 323, 326

[56] References Cited

U.S. PATENT DOCUMENTS

| | | | |
|---|---|---|---|
| 3,159,790 | 12/1964 | Pratt | 455/326 |
| 3,534,267 | 10/1970 | Hyltin | 455/321 |
| 4,061,990 | 12/1977 | Veno | 455/325 |
| 4,112,373 | 9/1978 | Miyamoto et al. | 455/333 |
| 4,193,036 | 3/1980 | Cerny, Jr. et al. | 455/333 |
| 4,219,779 | 8/1980 | Shinkawa et al. | 455/333 |
| 4,308,473 | 12/1981 | Carnes | 455/332 |
| 4,509,208 | 4/1985 | Sogo et al. | 455/325 |
| 4,541,123 | 9/1985 | Saka | 455/327 |
| 4,554,680 | 11/1985 | Jacobs et al. | 455/326 |

Primary Examiner—Jin F. Ng
Assistant Examiner—Elissa Seidenglanz
Attorney, Agent, or Firm—Richard K. Robinson; Leo N. Heiting; Melvin Sharp

[57] ABSTRACT

A single balanced self-oscillating dual gate FET mixer includes two dual-gate FETs, a dielectric resonator, two transmission lines inductively coupled to the resonator and connected to the second gates of the two dual-gate FETs, an RF input, two RF matching networks connected to the RF input and to the first gates of the two dual-gate FETs, a 180 degree power combiner, and two IF matching networks connected between the drains of the two dual-gate FETs and to the power combiner. The output of the power combiner is the IF output. The two dual-gate FETs comprise the active device of the oscillator and are used as a nonlinear mixing amplifier. The resonator network provides series feedback with gate 1 of each FET to produce the local oscillator signal and controls the frequency of oscillation. Single balancing of the local oscillator signals injected into gate 1 of each FET is accomplished by mutually coupling the resonator to the two transmission lines, thus providing the required 180 degree phase difference between signals. Finally, the 180 degree power combiner incorporates the phase change necessary for constructive addition of the IF signals originating from each drain port of each FET. With this structure the LO power is removed at the RF input to the mixer owing to the addition of leakage local oscillator signals that are 180 degrees out of phase.

7 Claims, 2 Drawing Figures

SINGLE BALANCED SELF-OSCILLATING DUAL GATE FET MIXER

This invention relates to superheterodyne mixers and more particularly to a single balanced self-oscillating dual-gate field effect transistor (FET) mixer.

In the past both single-gate and dual-gate FET's have been used in superheterodyne receivers incorporated in radar sets, satellite communication equipment and electronic warfare equipment. Dual-gate FETS used as mixers have the advantage over, for example, Schottky diodes or single-gate FET's because of the intrinsic separation of signal and local oscillator ports and the separate matching and direct combination of the corresponding powers inside the device.

In the dual-gate FET the local oscillator is connected to the second gate, the RF signal is connected to the first gate and the IF signal is extracted from the drain outputs. This arrangement separates the RF power from that of the LO power thus enabling the use of well known techniques for input power and noise matching. The IF is fed after reactive matching either to a 50 ohm load or to the input port of a post amplifier. The local oscillator signal leaks across to the RF port due to the inherent poor isolation from gate 2 to gate 1 of the FET, and may be removed from this port through use of a bank reject filter. When the local oscillator signal and RF signal are close in frequency, however, this type of filter is impossible to realize.

Accordingly, it is an object of this invention to provide a single balanced self-oscillating dual-gate FET mixer which provides inherent isolation from the local oscillator signal to the RF port.

Still another object of the invention is to provide a self-oscillating mixer with excellent LO to RF isolation characteristics which can be fabricated using a minimum of circuit area.

Briefly stated the invention comprises a two dual-gate FET mixer system with substantially improved LO to RF isolation characteristics obtainable through the relative phase of the LO input to selected gates. The isolation is achieved by LO cancellation at the RF injection gates.

Figure 2:
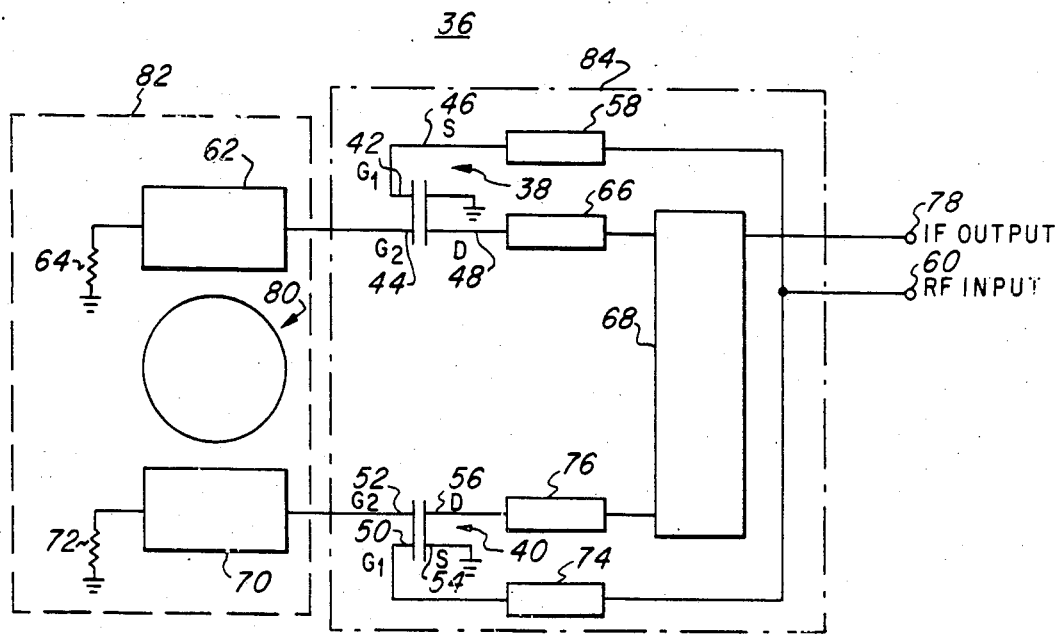

Other objects and features of the invention will become more readily apparent from the following detailed description when read in conjunction with the accompanying drawings, in which:

FIG. 1 is a schematic view, partly in block form, of a prior art dual-gate Fet mixer; and FIG. 2 is a schematic view, partly in block form, of the single balanced self-oscillating dual-gate FET mixer.

Referring now to FIG. 1, the prior art dual-gate metal/semiconductor field-effect transistor (MESFET) includes a dual-gate MESFET 12 having dual gates 14 and 16, drain 18 and source 20. Gate 14 is connected through impedance 22 to the RF signal source 24 and gate 16 is connected through impedance 26 to the local oscillator 28. The drain 18 is connected to the junction of microstripline 30 and reactor 32. The microstripline 30 is at ground potential and the reactor 32 is connected to a 50 ohm load 34, for example.

By injecting the RF signal and the local oscillator power into the gates, separation of the signal and local oscillator power is made so that well known techniques for input power and noise matching of gate 14 can be used. The stripline 30 is used to short circuit the $f_{LO}, f_{RF}$ at drain 18. The isolation of local oscillator signal from gate 16 to the RF port at gate 14 is determined solely by the gate to gate isolation inherent to the device.

In the self-oscillating mixer mode, the nonlinearities are of the same type as in the low noise mixer mode, except that now the channel resistance beats more and the transconductance less than before. Here, FET 12 figures also as an IF postamplifier. The transconductances of both FET's now have higher values as in the low-noise mixer case. This allows the device to be potentially unstable in the X-band. This effect can be utilized to tune the dual gate FET as an oscillator and employ it as a self-oscillating mixer. Since the oscillation amplitude is limited by the inherent saturation mechanism, nonlinear operation is assured, and an RF signal introduced into gate 14 is mixed down by the oscillating dual gate FET 12. Since the dc current is high-noise performance, it is worse than in the low-noise mixer case. Those persons skilled in the art desiring further information concerning the prior art devices are referred to an article by Christos Tsironis, Roman Meierer, and Rainer Stahlmann, "Dual-Gate MESFET Mixers" published in "IEEE Transactions on Microwave Theory and Techniques, Vol. MTT-32, No 3, March 1984.

Referring now to FIG. 2, the single balanced self-oscillating dual-gate FET mixer comprises two dual-gate MESFET's 38 and 40. Dual-gate MESFET 38 has first and second gates 42 and 44, source 46, and drain 48. Dual-gate MESFET 40 has first and second gates 50 and 52, source 54 and drain 56. Gate 42 of dual-gate 38 is connected through matching network 58 to the RF input terminal 60, and gate 44 is connected through transmission lines 62 and resistor 64 to ground. The drain of dual-gate MESFET 38 is connected through matching device 66 to a 180 degree power combiner 68, and the source 46 is connected to ground. Similarly, dual-gate MESFET 40 has its gate 50 connected through matching device 74 to the RF input terminal 60, and gate 52 connected through transmission line 70 and resistor 72 to ground. The drain 56 of dual-gate MESFET 40 is connected through matching device 76 to the 180 degree power combiner 68 and its source 54 connected to ground. The output of 180 degree power combiner 68 is connected to IF output terminal 78. Finally, a resonator 80 is inductively coupled to the transmission lines 62 and 70.

The single balanced self-oscillating dual-gate FET mixer, for example can be fabricated on two chips. The first chip is a dielectric substrate upon which is mounted a dielectric resonator disk 80 between the two transmission lines 62 and 70. The transmission lines 62 and 70 together with their corresponding resistors 64 and 72 are formed on the dielectric substrate using thin film deposition techniques. A conductive box (not shown) forms the cavity of the resonator and a housing for the first chip. A suitable dielectric disk resonator is an S series resonator sold under the trademark RESOMICS by Muratta Erie Company.

The second chip is a gallium arsenide substrate. The two MESFET's are formed by removing any insulation from under the source, drain and gate metallization (contacts), and depositing a voltage-controlled constriction metal stripe on the surface of the channel. This metal gate electrode forms a rectifying Schottky barrier contact that depletes the underlying layer of electrons to a depth which is determined by the applied voltage, and as the gate voltage polarity changes, the depleted region is altered, correspondingly reducing current flow. GaAs has about six times greater conductivity than silicon doped to the same level with n-type impurities. Those persons skilled in the art desiring more information about fabricating a MESFET on GaAs are referred to an article by R. Van Tuyl and C. Liechti in the March, 1977 issue of "IEEE Spectrum (p. 41). The RF matching devices 58 and 74, the IF matching devices 66 and 76 and the power combiner 68 may be, for example, transmission line metallizations formed on the GaAs substrate using thin film deposition techniques. The power combiner 68 may also be, for example, a differential amplifier fabricated on the GaAs substrate. Thus, a monolithic self-oscillating mixer is fabricated using a minimum of circuit area.

In operation, RF energy connected to RF input terminal 60 is applied to gates 42 and 52 of dual-gate FET's 38 and 40. Simultaneously, the dielectric cavity resonator 80 is activated to induce LO power on transmission lines 62 and 70. In order to have a single balanced structure two of the three signals (LO, IF and RF) in the mixer must have 180 degree phase relationships between each nonlinear element. By placing the dielectric resonator between the two transmission lines the current induced in the transmission lines 62 and 70 is 180 degrees out of phase, i.e., the power phase on transmission line 70 is shifted 180 degrees with respect to the power phase on transmission line 62. Thus, the need for a BALUN or transformer at the LO port is eliminated. Transmission lines 62 and 70 have impedances equal to the resistance of resistors 64 and 72. The transmission lines apply their LO power out of phase to RF gates 44 and 52, respectively. The effect is a substantial cancellation of the LO power at the gates 42 and 52 during mixing and no significant leakage of LO power to drains 46 and 56 occurs. The IF outputs of the two dual-gate mixers are also out of phase; thus the "two out of three signals out of phase" condition is met. The IF output of drains 48 and 56 passes through the load circuits 66 and 76 to transfer the power to the 180 degree power combiner 68. The power combiner 68 removes the phase shift and outputs the IF power in phase.

Although only a single embodiment of this invention has been described, it will be apparent to a person skilled in the art that various modifications to the details of construction shown and described may be made without departing from the scope of this invention.

What is claimed is:
1. A self-oscillating mixer comprising:
   an RF input input terminal for receiving RF signals;
   a first circuit means for receiving and mixing the RF signals with a first signal and includes a first device having a first and second gate with the first gate being for receiving the RF signals for mixing with the first signal to obtain a first mixed signal and a first resonator circuit means operatively connected to the second gate for generating the first signal;
   a second circuit means for receiving and mixing the RF signal with a second signal and includes a second device having a third and fourth gate with the third gate being for mixing RF signals with the second signal to obtain a second mixed signal and a second resonator circuit means operatively to the second gate for generating the second signal;
   the first and second resonator circuit means includes means for maintaining a phase differential between the first and second signals; and
   power combiner means for combining at a predetermined angle the first mixed signal with the second mixed signal to obtain a combined signal.
2. The self-oscillating mixer according to claim 1 wherein the first and second resonator circuit comprises:
   a dielectric resonator and first and second transmission lines, the dielectric resonator operatively positioned with respect to the first and second transmission lines for inducing the first signal and the second signal, respectively, in the first and second transmission lines.
3. The self-oscillating mixer according to claim 1 wherein the power combiner means is a differential amplifier.
4. The self-oscillating mixer according to claim 1 wherein the power combiner means is a strip line type power combiner.
5. The self-oscillating mixer according to claim 1 wherein the first and second resonator circuits are fabricated on a dielectric substrate.
6. The self-oscillating mixer according to claim 1 wherein the first and second device, and power combiner means are fabricated on a monolithic chip.
7. The self-oscillating mixer according to claim 6 wherein the monolithic chip is a GaAs chip.

* * * * *